(12) United States Patent
French, Jr. et al.

(10) Patent No.: US 8,087,951 B1
(45) Date of Patent: Jan. 3, 2012

(54) DUAL FORCE SINGLE POINT ACTUATION INTEGRATED LOAD MECHANISM FOR SECURING A COMPUTER PROCESSOR TO A SOCKET

(75) Inventors: Michael D. French, Jr., Raleigh, NC (US); Michael S. Miller, Raleigh, NC (US); Peter A. Smith, Cary, NC (US); Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/949,979

(22) Filed: Nov. 19, 2010

Related U.S. Application Data

(63) Continuation of application No. 12/831,318, filed on Jul. 7, 2010, now Pat. No. 7,878,838.

(51) Int. Cl.
*H01R 13/62* (2006.01)
(52) U.S. Cl. .................................... 439/331; 439/342
(58) Field of Classification Search ........... 439/331, 439/342, 71, 73
See application file for complete search history.

(56) References Cited

U.S. PATENT DOCUMENTS

| | | | |
|---|---|---|---|
| 6,191,480 B1 | 2/2001 | Kastberg et al. | |
| 6,916,195 B2 | 7/2005 | Byquist | |
| 6,969,267 B2 | 11/2005 | Byquist | |
| 7,001,197 B2 | 2/2006 | Shirai et al. | |
| 7,070,436 B2 | 7/2006 | Chin | |
| 7,101,209 B2 | 9/2006 | Yates et al. | |
| 7,163,406 B2 | 1/2007 | Ma | |
| 7,179,092 B2 | 2/2007 | Ma | |
| 7,252,517 B2* | 8/2007 | Ju | 439/73 |
| 7,258,563 B2* | 8/2007 | Ju | 439/331 |
| 7,371,100 B1* | 5/2008 | Polnyi | 439/331 |
| 7,736,167 B2* | 6/2010 | Liao | 439/331 |
| 2002/0137369 A1 | 9/2002 | Edwards et al. | |
| 2004/0192083 A1 | 9/2004 | Byquist | |
| 2008/0081489 A1 | 4/2008 | MacGregor et al. | |

* cited by examiner

*Primary Examiner* — Briggitte R Hammond
(74) *Attorney, Agent, or Firm* — H. Barrett Spraggins; Thomas E. Tyson; Biggers & Ohanian, LLP

(57) ABSTRACT

A dual force single point actuation integrated load mechanism for securing a computer processor to a socket, the dual force single point actuation integrated load mechanism including a base mounted around the socket; and a load plate rotatably coupled to the base and secured to the base when an activate lever and a hinge lever are secured above the load plate.

15 Claims, 6 Drawing Sheets

DUAL FORCE SINGLE POINT ACTUATION INTEGRATED LOAD MECHANISM FOR SECURING A COMPUTER PROCESSOR TO A SOCKET

CROSS-REFERENCE TO RELATED APPLICATION

This application is a continuation application of and claims priority from U.S. patent application Ser. No. 12/831,318, filed on Jul. 7, 2010.

BACKGROUND OF THE INVENTION

1. Field of the Invention

The field of the invention is data processing systems, or, more specifically, a dual force single point actuation integrated load mechanism for securing a computer processor to a socket and an apparatus with a computer processor securely mounted within a socket.

2. Description of Related Art

Modern computing systems often include powerful computer processors that are mounted within sockets. The sockets may be attached to a printed circuit board ('PCB') such as a motherboard and be configured to house a computer processor. Modern processors may require that a force be applied to the processor in order for the processor to remain situated within the socket such that the processor maintains a reliable electrical connection to the socket.

SUMMARY OF THE INVENTION

A dual force single point actuation integrated load mechanism for securing a computer processor to a socket is disclosed. The dual force single point actuation integrated load mechanism includes a base mounted around the socket. The dual force single point actuation integrated load mechanism also includes a load plate rotatably coupled to the base and secured to the base when an activate lever on a first side of the base and a hinge lever on a second side of the base are secured above the load plate. The activate lever on the first side of the load plate is rotatably coupled with the base and is secured when the activate lever is fully rotated. The hinge lever on the second side of the load plate is rotatably coupled with the base and connected to the activate lever such that rotating the activate lever rotates the hinge lever. The hinge lever is therefore secured when the activate lever is secured.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
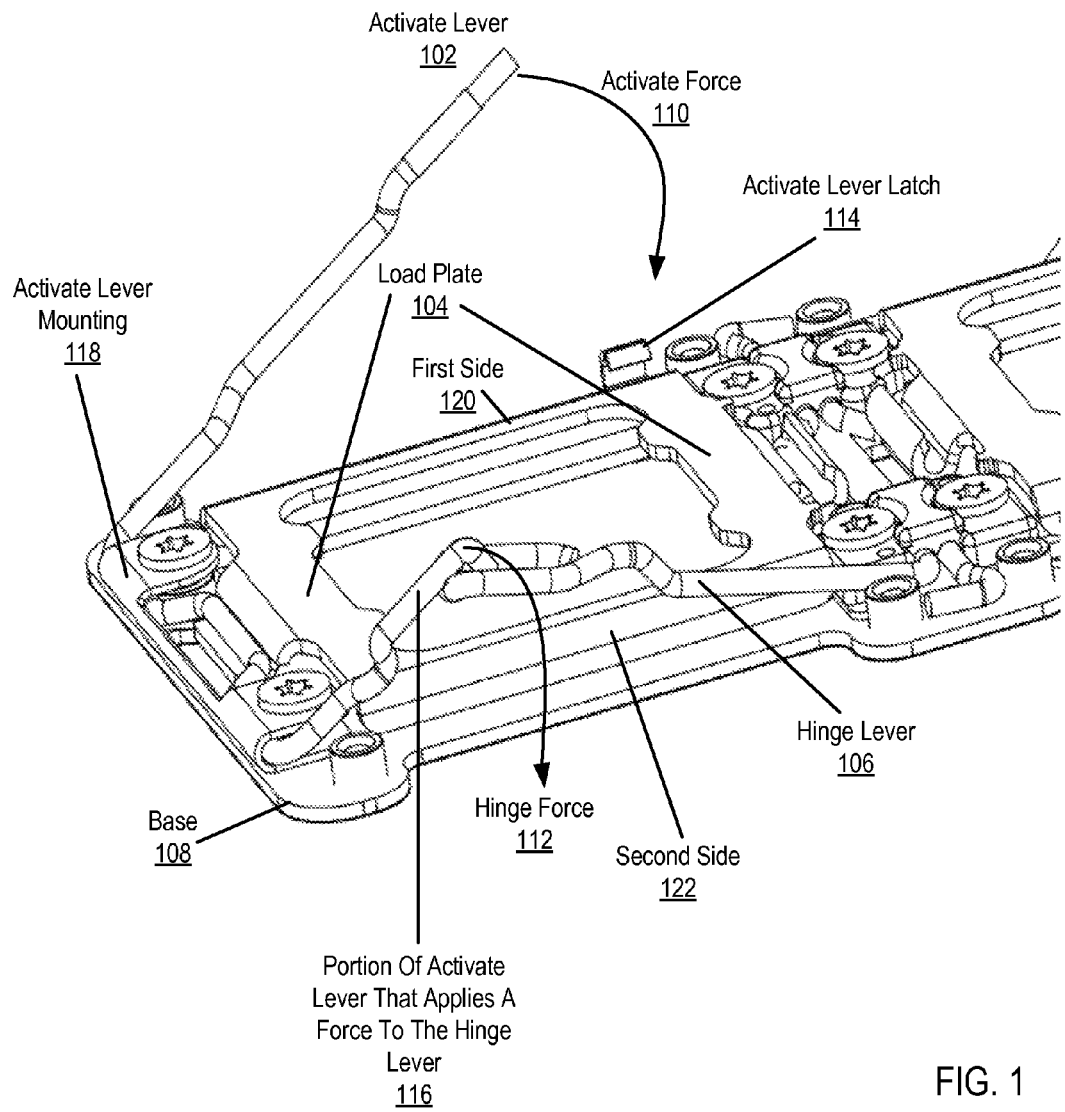
FIG. 1 sets forth a line drawing of a dual force single point actuation integrated load mechanism for securing a computer processor to a socket.

Exemplary apparatus and dual force single point actuation integrated load mechanisms for securing a computer processor to a socket in accordance with the present invention are described with reference to the accompanying drawings, beginning with FIG. 1. FIG. 1 sets forth a line drawing of a dual force single point actuation integrated load mechanism for securing a computer processor to a socket. The dual force single point actuation integrated load mechanism for securing a computer processor to a socket of FIG. 1 includes a base (108) mounted around the socket (not shown) for receiving a computer processor. The socket for receiving a computer processor may be embodied as an electrical component that is mounted on a printed circuit board ('PCB') and further configured to receive and house a computer processor. The socket for receiving a computer processor forms an electrical interface between the computer processor and the structure, such as the PCB, that the socket is mounted on. In the example of FIG. 1, the base (108) may be mounted, for example, on the PCB or otherwise mounted on the socket so as to provide a force to the computer processor, thereby securing the computer processor to the socket. The base (108) may also be mounted to a stiffener or back-plate underneath the PCB such that the dual force single point actuation integrated load mechanism can secure the computer processor to the socket.

The dual force single point actuation integrated load mechanism for securing a computer processor to a socket of FIG. 1 also includes a load plate (104) rotatably coupled to the base (108) via a hinge lever (106). The load plate (104) is rotatably coupled to the base (108) such that one side of the load plate (104) remains coupled to the base (108) while the other three sides of the load plate (104) may be decoupled from the base (108), thereby allowing the load plate (104) to be disengaged from the computer processor that the integrated load mechanism is securing to the socket. An illustration of this concept is illustrated and described in greater detail with reference to FIG. 4.

The load plate (104) of FIG. 1 is also secured to the base (108) when an activate lever (102) on a first side (120) of the base (108) and a hinge lever (106) on a second side (122) of the base (108) are secured above the load plate (104). The activate lever (102) and the hinge lever (106) may be coupled to, for example, torsion springs that apply a force to each lever (102, 106) such that each lever is rotated away from the base (108) in the absence of any other force being applied to each lever (102, 106). In the example of FIG. 1, the activate lever (102) on the first side (120) of the base (108) and the hinge lever (106) on the second side (122) of the base (108) are not in a secured position above the load plate (104). Placing the activate lever (102) on the first side (120) of the base (108) and the hinge lever (106) on the second side (122) of the base (108) in a secured position above the load plate (104) will be described in more detail below.

In the example of FIG. 1, the activate lever (102) on the first side (122) of the load plate (104) is rotatably coupled with the base (108). The activate lever (102) of FIG. 1 is secured when the activate lever (112) is fully rotated. For example, applying an activate force (110) to the activate lever (102) would force the activate lever (102) towards the activate lever latch (114) of FIG. 1, given that the activate lever (102) is rotatably coupled to the base (108). When the activate lever (102) is fully rotated, the activate lever (102) will be held in place by the activate lever latch (114), at which point the activate lever (102) would be in a "secured position," as the term is used in this application.

In the example of FIG. 1, the hinge lever (106) on the second side (122) of the load plate (104) is also rotatably coupled with the base (108). The hinge lever (106) of FIG. 1 is also connected to the activate lever (102) such that rotating the activate lever (102) rotates the hinge lever (106), given that the hinge lever (106) is rotatably coupled with the base (108). For example, applying an activate force (110) to the activate lever (102) forces the activate lever (102) towards the activate lever latch (114) of FIG. 1. In the example of FIG. 1, the activate lever (102) is a single piece metal or other rigid material that runs under an activate lever mounting (118) and extends towards the hinge lever (106), such that a portion (116) of the activate lever (102) is available to apply a force (112) to the hinge lever (106). When the activate lever (102) rotates towards the base (108) and the activate lever latch (114), the portion (116) of the activate lever (102) that is available to apply a force (112) to the hinge lever (106) also rotates in the same direction, thereby exerting a hinge force (112) on the hinge lever (106) such that the hinge lever (106) also rotates towards the base (108). In the example of FIG. 1, the hinge lever (106) is secured when the activate lever (102) is secured, which occurs when the activate lever (102) has been fully rotated and is held in place by the activate lever latch (114).

In the example of FIG. 1, the activate lever (102) applies a first force to the load plate (104) when the activate lever (102) is secured. The hinge lever (106) of FIG. 1 similarly applies a second force to the load plate (104) when the hinge lever (106) is secured. The forces applied to the load plate (104) by the activate lever (102) and the hinge lever (106) force the load plate (104) down towards the base (108), thereby causing a force to be exerted on the computer processor by the load plate (104) and helping to secure the computer processor within the socket. In the example of FIG. 1, the magnitude of the first force applied by the activate lever (102) and the magnitude of the second force applied by the hinge lever (106) may be within a predetermined threshold such as, for example, within a predetermined percentage of each other.

In the example of FIG. 1, and as described above, the dual force single point actuation integrated load mechanism may also include an activate lever latch (114) for securing the activate lever. The activate lever latch (114) operates to hold the activate lever (102) in a secured position so that each lever (102, 106) continues to exert a force on the load plate (104) that is transferred to the computer processor to keep the computer processor securely mounted within the socket.

In the example of FIG. 1, the dual force single point actuation integrated load mechanism includes an activate lever (102) that includes hooked end at the portion (116) of the activate lever that applies a force to the hinge lever (106). The hooked end of the activate lever (102) is interlocked with the hinge lever (106) via a looped end of the hinge lever (106). Interlocking the hooked end of the activate lever (102) with the looped end of the hinge lever (106) provides for a reliable and secure connection between the activate lever (102) and the hinge lever (106) such that the activate lever (102) can reliably control the positioning of the hinge lever (106).

Figure 2:
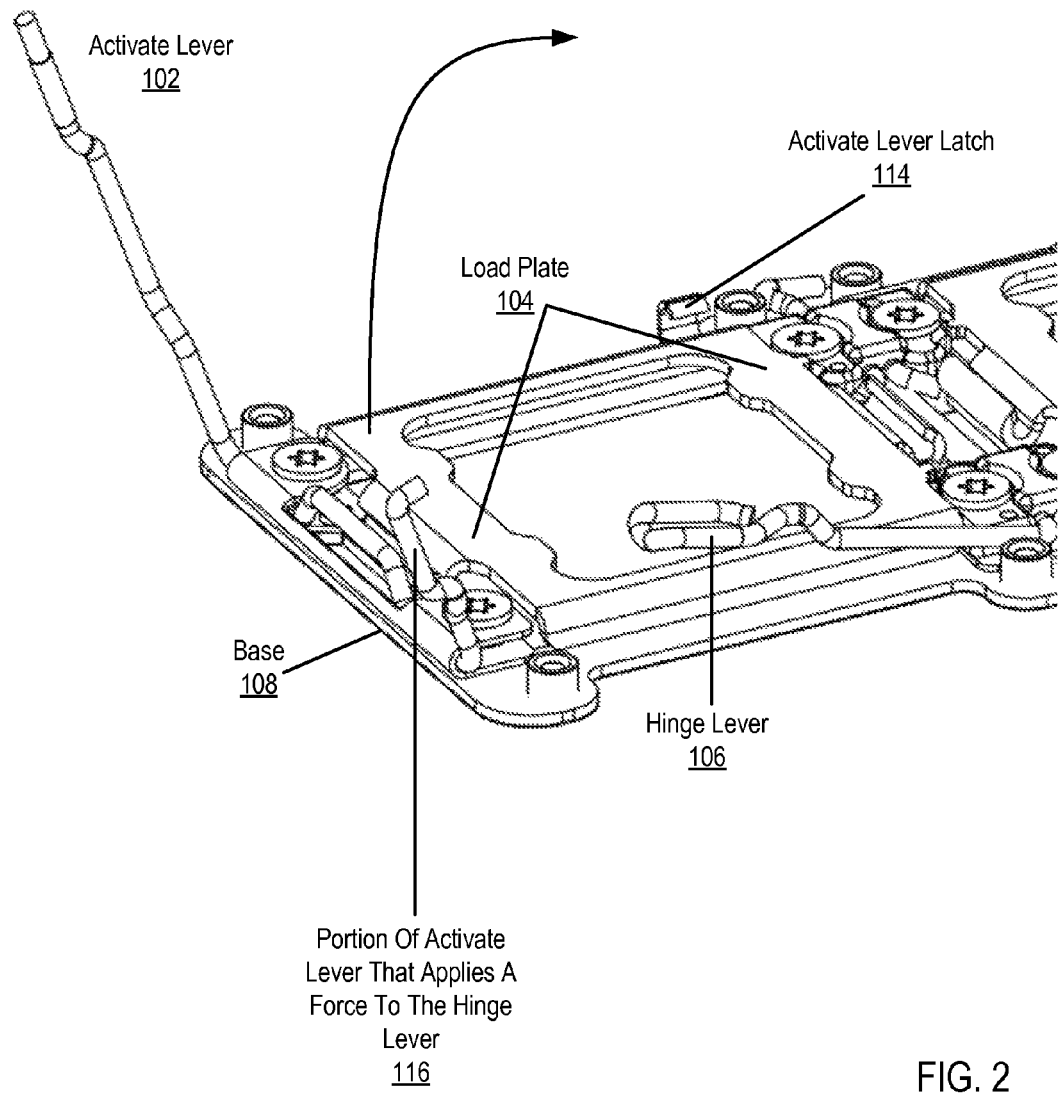
FIG. 2 sets forth a line drawing of a dual force single point actuation integrated load mechanism for securing a computer processor to a socket.

For further explanation, FIG. 2 sets forth an additional line drawing of a dual force single point actuation integrated load mechanism for securing a computer processor to a socket. The dual force single point actuation integrated load mechanism of FIG. 2 is identical to the dual force single point actuation integrated load mechanism of FIG. 1, as it also includes the activate lever (102), the load plate (104), the hinge lever (106), the base (108), the activate lever latch (114), and the portion (116) of the activate lever that applies a force to the hinge lever (106). In the example of FIG. 2, however, the activate lever (102) and the hinge lever (106) are in a completely unsecured position such that the activate lever (102) and hinge lever (106) are not securing the load plate (104). As described above, the load plate (104) is rotatably coupled to the base (108). When the activate lever (102) and hinge lever (106) are not securing the load plate (104), the load plate (104) may therefore be rotated upwards such that the load plate can be disengaged from the computer processor, allowing for removal of the computer processor.

In the example of FIG. 2, the hooked end of the activate lever (102), which is located at the portion (116) of the activate lever (102) that applies a force to the hinge lever (106), and the looped end of the hinge lever (106) are not interlocked. In this particular configuration, the activate lever (102) is not exerting a force on the hinge lever (106) and is not controlling the positioning of the hinge lever (106). In such an example, the activate lever (102) would need to be rotated towards the activate lever latch (114), at which point the hooked end of the activate lever (102) would engage the looped end of the hinge lever (106) thereby enabling the activate lever (102) to exert a force on the hinge lever (106) forcing the hinge lever (106) to be rotated towards the base (108).

Figure 3:
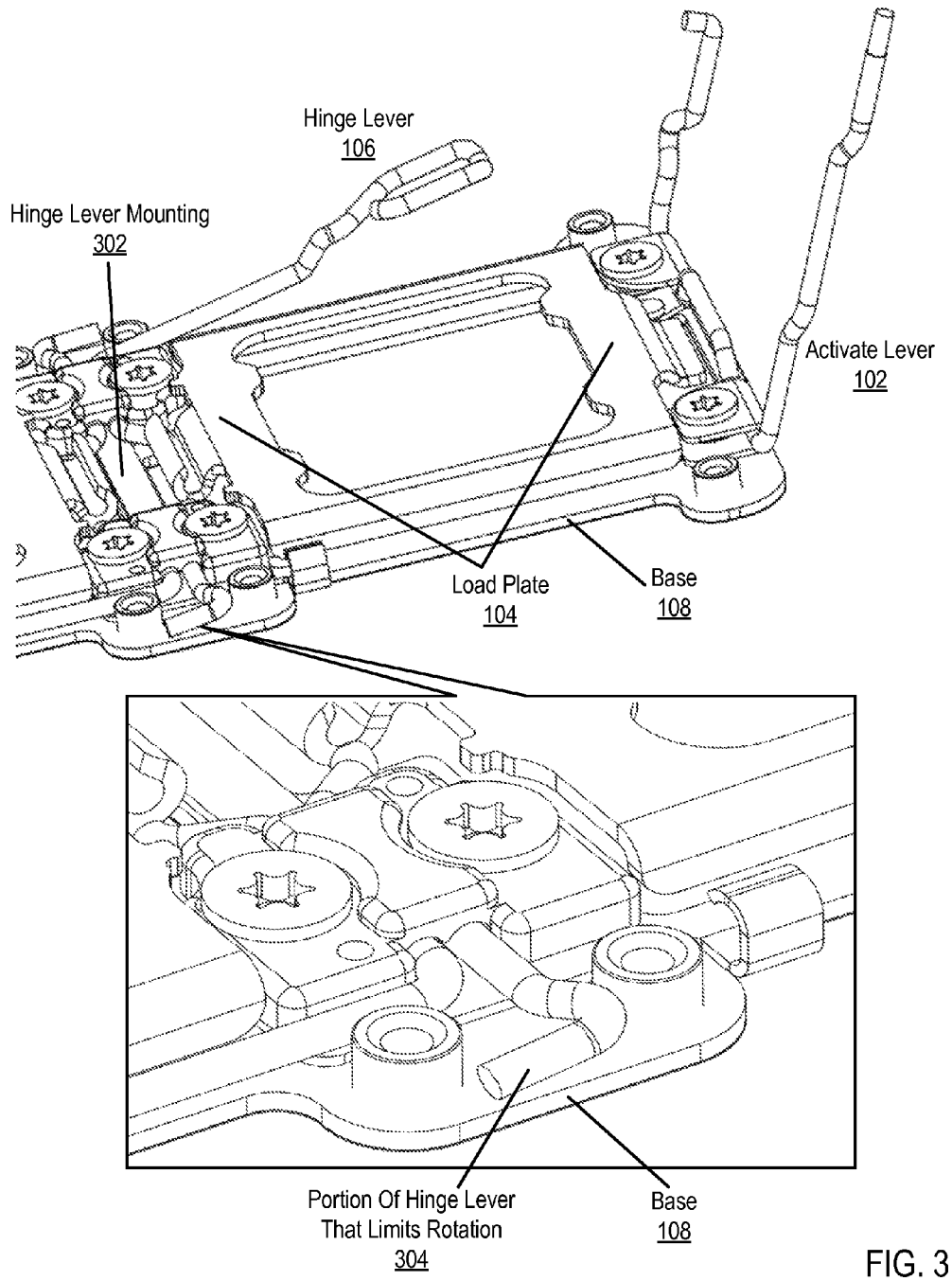
FIG. 3 sets forth a line drawing of a dual force single point actuation integrated load mechanism for securing a computer processor to a socket.

For further explanation, FIG. 3 sets forth an additional line drawing of a dual force single point actuation integrated load mechanism for securing a computer processor to a socket. The dual force single point actuation integrated load mechanism of FIG. 3 is identical to the dual force single point actuation integrated load mechanism of FIG. 1 and FIG. 2, as it also includes the activate lever (102), the load plate (104), the hinge lever (106), the base (108), the activate lever latch (114), and the portion (116) of the activate lever that applies a force to the hinge lever (106). In fact, components of the dual force single point actuation integrated load mechanism are positioned as in FIG. 2, but illustrated from a different perspective.

In the example of FIG. 3, the hinge lever mounting (302) and the portion (304) of the hinge lever (106) that limits rotation are also labeled. The hinge lever mounting (302) is the physical housing that is used to connect the hinge lever (106) to the base (108). One end of the hinge lever (106) of FIG. 3 has a looped end as described above with reference to FIG. 1 and FIG. 2. The other end of the hinge lever (106) is shaped such that this end serves as the portion (304) of the hinge lever (106) that limits the rotation of the hinge lever (106). In between these two ends of the hinge lever (106), the hinge lever is mounted within the hinge lever mounting (302) such that the hinge lever (106) is connected to the base (108) of the dual force single point actuation integrated load mechanism for securing a computer processor to a socket.

In the example of FIG. 3, the hinge lever (106) operates as a hinge for the load plate (104), which is coupled to the hinge lever (106) at the hinge lever mounting (302) such that the load plate (104) can rotate about the hinge lever (106). As described above with reference to FIG. 1 and FIG. 2, the looped end of the hinge lever (106) can receive a force from the hooked end of the activate lever (102) such that the looped end of the hinge lever (106) is forced down towards the base (108) of the dual force single point actuation integrated load mechanism. When the activate lever (102) is not exerting a force on the hinge lever (106), as illustrated in FIG. 3, the looped end of the hinge lever (106) may rotate away from the base (108) of the dual force single point actuation integrated load mechanism. The range of rotation is limited, however, by the portion (304) of the hinge lever (106) that limits the rotation of the hinge lever (108) which comes into contact with the base (108) as the looped end of the hinge lever (106) rotates away from the base (108).

Figure 4:
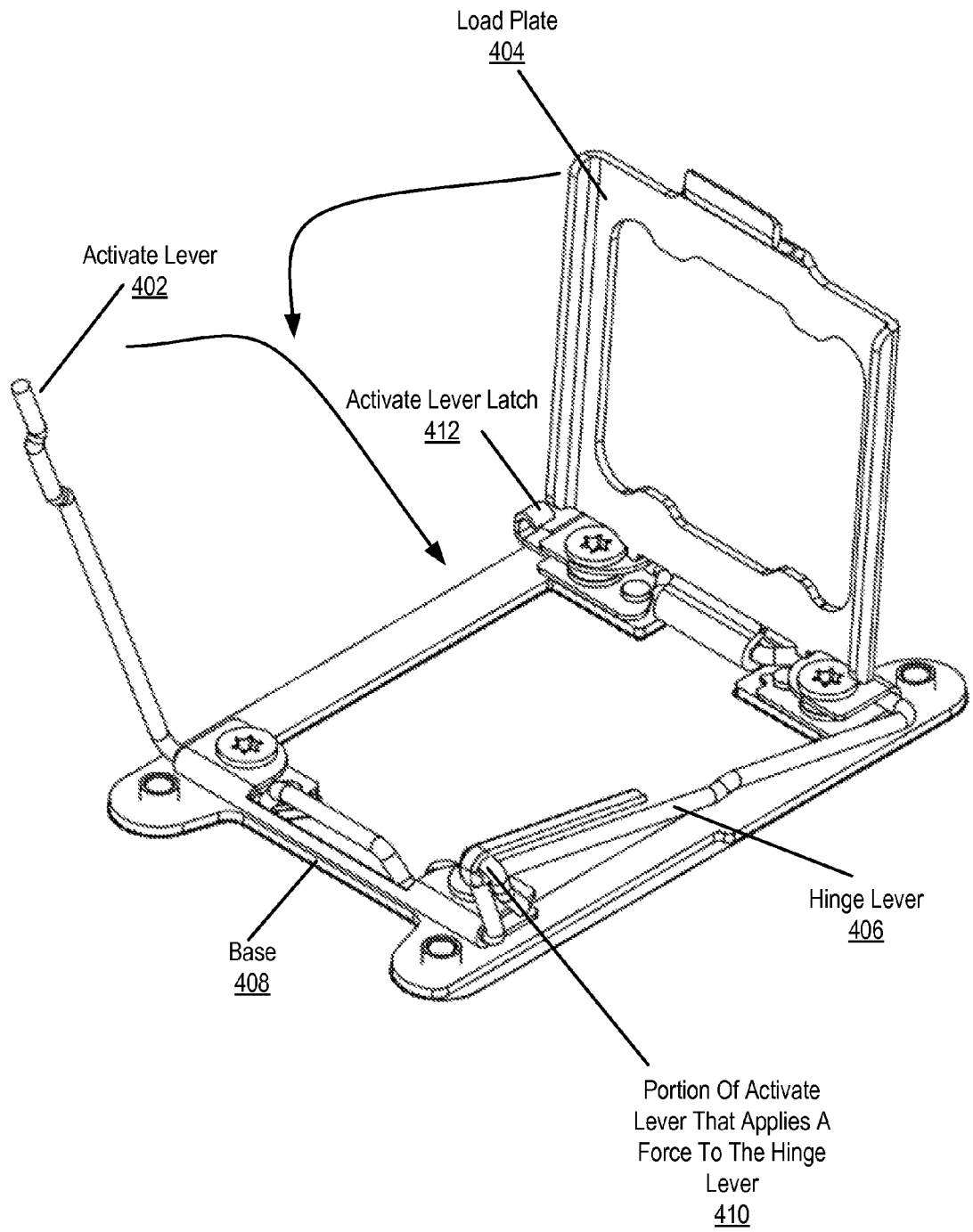
FIG. 4 sets forth a line drawing of a dual force single point actuation integrated load mechanism for securing a computer processor to a socket.

For further explanation, FIG. 4 sets forth an additional line drawing of a dual force single point actuation integrated load mechanism for securing a computer processor to a socket. The dual force single point actuation integrated load mechanism of FIG. 4 is similar to the dual force single point actuation integrated load mechanism described in FIGS. 1-3, as it includes a base (408), a load plate (404), an activate lever (402), and a hinge lever (406) that is controlled by a portion (410) of the activate lever (402) that applies a force to the hinge lever (406).

The dual force single point actuation integrated load mechanism of FIG. 4, however, differs from the dual force single point actuation integrated load mechanism illustrated in FIGS. 1-3 in that the hinge lever (406) does not include a looped end that is interlocked with the hooked end of the activate lever (102). Instead, the hinge lever (406) also has a hooked end. In the example of FIG. 4, the positioning of the hinge lever (406) is controlled by a hooked end of an activate lever (402) that limits the movement of the hinge lever (406). For example, when the activate lever (402) is in a secured position and restricted by the activate lever latch (412), the design of the hooked end is such that the hinge lever (406) is also in a secured position so that both levers are exerting forces on the load plate (404), thereby securing the computer processor in the socket. When the activate lever (402) in rotated away from the base (408) into an unsecured position, as illustrated in FIG. 4, the hooked end of the activate lever (402), by virtue of its physical design, moves within a slot formed by the hooked end of the hinge lever (406) such that the hinge lever (406) rotates away from the base (408).

Figure 5:
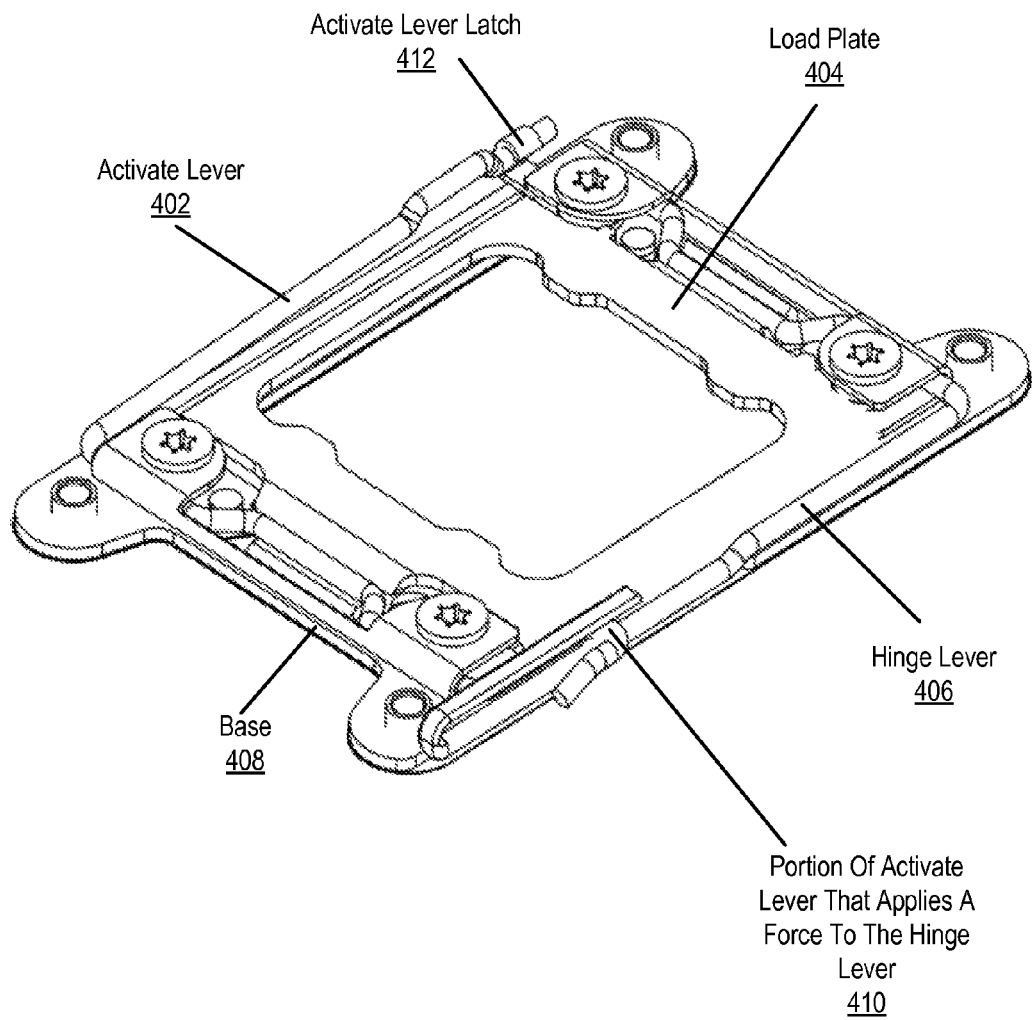
FIG. 5 sets forth a line drawing of a dual force single point actuation integrated load mechanism for securing a computer processor to a socket.

For further explanation, FIG. 5 sets forth an additional line drawing of a dual force single point actuation integrated load mechanism for securing a computer processor to a socket. The dual force single point actuation integrated load mechanism of FIG. 5 is identical to the dual force single point actuation integrated load mechanism of FIG. 4, as it also includes the activate lever (402), the load plate (404), the hinge lever (406), the base (408), the activate lever latch (412), and the portion (410) of the activate lever (402) that applies a force to the hinge lever (406). In the example of FIG. 5, the activate lever (402) and the hinge lever (406) are in a completely secured position such that the activate lever (402) and hinge lever (406) are securing the load plate (404).

Figure 6:
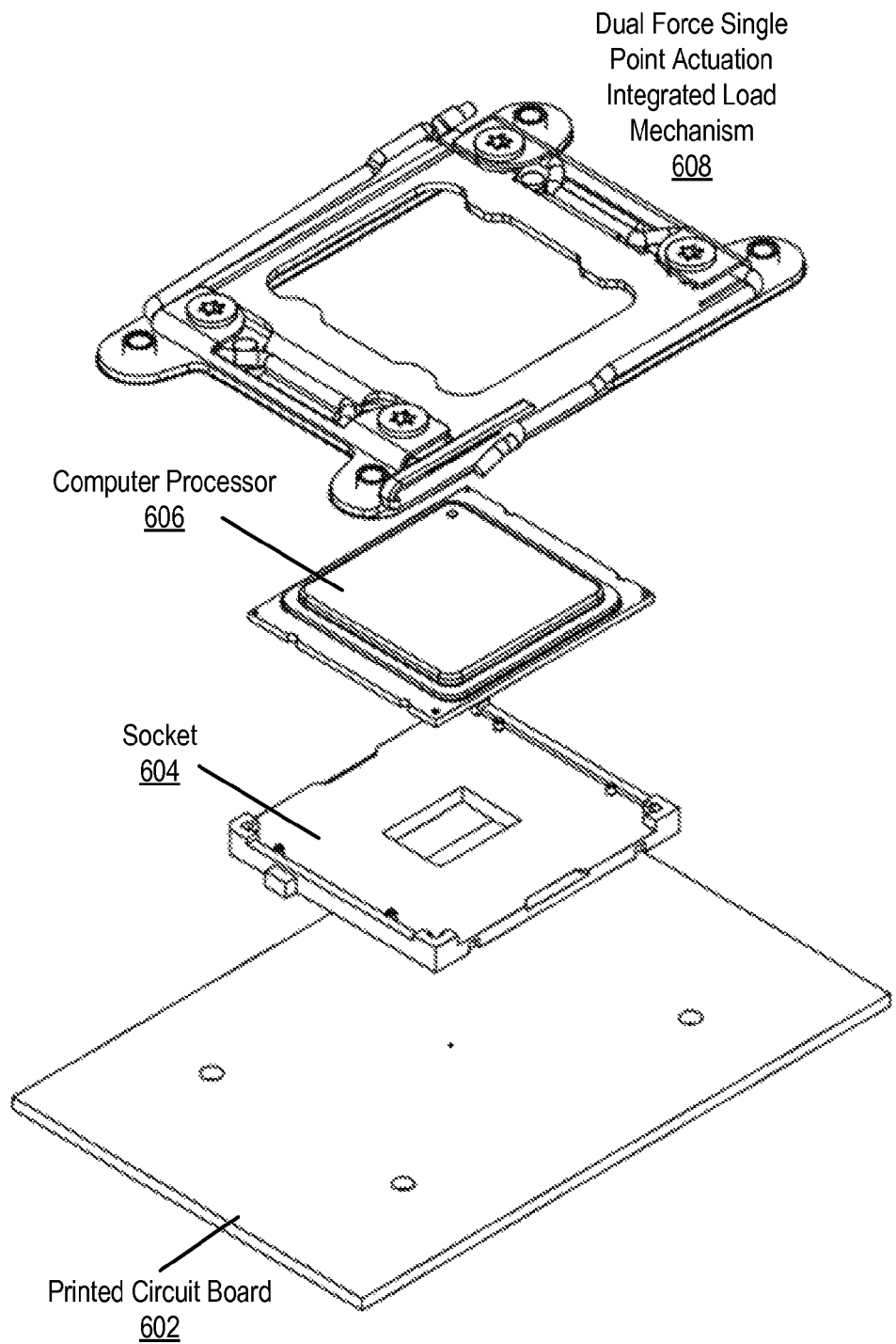
FIG. 6 sets forth a line drawing of an apparatus with a computer processor securely mounted within a socket.

For further explanation, FIG. 6 sets forth a line drawing of an apparatus with a computer processor (606) securely mounted within a socket (604). The apparatus of FIG. 6 also includes a dual force single point actuation integrated load mechanism (608) for securing the computer processor (606) to the socket (604) as described above with reference to FIGS. 1-5. The apparatus of FIG. 6 may also include a PCB (602) upon which the socket (604) is mounted. The apparatus of FIG. 6 may be embodied, for example, as a personal computer, a blade in a blade server, or any other computing device as will occur to those of skill in the art.

The dual force single point actuation integrated load mechanism (608) for securing the computer processor to the socket may be embodied as described above with reference to FIGS. 1-5. In the example of FIG. 6, the dual force single point actuation integrated load mechanism (608) may include a base mounted around the socket (604) and a load plate rotatably coupled to the base and secured to the base when an activate lever on a first side of the base and a hinge lever on a second side of the base are secured above the load plate. In the example of FIG. 6, the activate lever on the first side of the load plate is rotatably coupled with the base and is secured when the activate lever is fully rotated. In the example of FIG. 6, the hinge lever on the second side of the load plate is rotatably coupled with the base and connected to the activate lever such that rotating the activate lever rotates the hinge lever. The hinge lever of FIG. 6 is secured when the activate lever is secured.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A dual force single point actuation integrated load mechanism for securing a computer processor to a socket, the dual force single point actuation integrated load mechanism comprising:
    a base mounted around the socket; and
    a load plate rotatably coupled to the base and secured to the base when an activate lever and a hinge lever are secured above the load plate, wherein securing the activate lever secures the hinge lever.

2. The dual force single point actuation integrated load mechanism of claim 1 wherein the activate lever applies a first force to the load plate when the activate lever is secured and wherein the hinge lever applies a second force to the load plate when the hinge lever is secured.

3. The dual force single point actuation integrated load mechanism of claim 2 wherein the magnitude of the first force and the magnitude of the second force are within a predetermined threshold.

4. The dual force single point actuation integrated load mechanism of claim 1 further comprising an activate lever latch for securing the activate lever.

5. The dual force single point actuation integrated load mechanism of claim 1 wherein the hinge lever is secured when the activate lever is secured by applying a hinge force to the hinge lever through a hooked end of the activate lever that is connected to the hinge lever.

6. The dual force single point actuation integrated load mechanism of claim 5 wherein the hooked end of the activate lever is connected to the hinge lever via a looped end of the hinge lever.

7. The dual force single point actuation integrated load mechanism of claim 1 wherein the hinge lever is not fully secured when the activate lever is unsecured.

8. An apparatus with a computer processor securely mounted within a socket, the apparatus comprising:
    a computer processor and a dual force single point actuation integrated load mechanism for securing the computer processor to the socket, the dual force single point actuation integrated load mechanism comprising:
    a base mounted around the socket; and
    a load plate rotatably coupled to the base and secured to the base when an activate lever and a hinge lever are secured above the load plate, wherein securing the activate lever secures the hinge lever.

9. The apparatus of claim 8 wherein the activate lever applies a first force to the load plate when the activate lever is secured and wherein the hinge lever applies a second force to the load plate when the hinge lever is secured.

10. The apparatus of claim 9 wherein the magnitude of the first force and the magnitude of the second force are within a predetermined threshold.

11. The apparatus of claim 8 further comprising an activate lever latch for securing the activate lever.

12. The apparatus of claim 8 wherein the hinge lever is secured when the activate lever is secured by applying a hinge force to the hinge lever through a hooked end of the activate lever that is connected to the hinge lever.

13. The apparatus of claim 12 wherein the hooked end of the activate lever is connected to the hinge lever via a looped end of the hinge lever.

14. The apparatus of claim 8 wherein the hinge lever is not fully secured when the activate lever is unsecured.

15. A dual force single point actuation integrated load mechanism for securing a computer processor to a socket, the dual force single point actuation integrated load mechanism comprising:

a base mounted around the socket; and a load plate, the load plate secured to the base when an activate lever and a hinge lever are secured above the load plate, wherein securing the activate lever secures the hinge lever.

* * * * *